United States Patent [19]
Terakado et al.

[11] Patent Number: 5,524,811
[45] Date of Patent: Jun. 11, 1996

[54] WIRE BONDING METHOD

[75] Inventors: Yoshimitsu Terakado; Kazuo Sugiura; Tooru Mochida; Tatsunari Mii, all of Tokyo, Japan

[73] Assignee: Kabushiki Kaisha Shinkawa, Tokyo, Japan

[21] Appl. No.: 309,937

[22] Filed: Sep. 21, 1994

[30] Foreign Application Priority Data

Sep. 21, 1993 [JP] Japan .................................. 5-257644

[51] Int. Cl.⁶ ................................................. H01L 21/607
[52] U.S. Cl. ..................................... 228/110.1; 228/180.5
[58] Field of Search .................................. 228/110.1, 4.5, 228/180.5

[56] References Cited

U.S. PATENT DOCUMENTS 5,111,989  5/1992  Holdgrafer et al. ............... 228/110.1

FOREIGN PATENT DOCUMENTS 57-87143  5/1982  Japan .............................. H01L 21/60
1-26531   5/1989  Japan .............................. H01L 21/60

Primary Examiner—Kenneth J. Ramsey
Attorney, Agent, or Firm—Koda and Androlia

[57] ABSTRACT

In a bonding method for bonding with a wire a first bonding point and then a second bonding point, a capillary that carries the wire is moved in a direction which is opposite from the first bonding point at the same time that an ultrasonic vibration is applied to the capillary during bonding to the second bonding point. Such a movement of the opposite direction can occur 10–20 ms after the application of the ultrasonic vibration at the second bonding point.

7 Claims, 2 Drawing Sheets

WIRE BONDING METHOD

BACKGROUND OF THE INVENTION

1. Field of the Invention

The present invention relates to a wire bonding method for connecting two bonding points.

2. Prior Art

The manufacturing processes of assembled semiconductor devices, such as IC's, etc., include a wire bonding process. In this process, as shown in FIG. 2, a wire 3 is connected to pads (first bonding points) 1a on a pellet 1 and leads (second bonding points) 2a on a lead frame 2. The arrows A in FIG. 2 indicate the direction of looping.

Various methods have been proposed as wire bonding methods for use in the wire bonding process. The most commonly used method is illustrated in FIG. 3.

In this method, as shown in FIG. 3a, a ball 3a is formed by the spark discharged by an electric torch 5 on a wire 3 which extends from the lower end of a capillary 4. The electric torch 5 is moved in the direction indicated by the arrow. Then, as shown in FIG. 3b, the capillary 4 is moved to a point above the first bonding point 1a, and as shown in FIG. 3c the capillary 4 is lowered so that the ball 3a at the tip of the wire 3 is pressed against the first bonding point 1a. Thereafter, an ultrasonic vibration is applied to the capillary 4 by the horn that holds the capillary 4, thus bonding the ball 3a.

When the ball 3a has thus been bonded to the first bonding point 1a, as shown in FIG. 3d, the capillary 4 is raised and as shown in FIG. 3e moved in the looping direction A so that the capillary 4 is located above the second bonding point 2a. Next, as shown in FIG. 3f, the capillary 4 is lowered so that the wire 3 is pressed against the second bonding point 2a, and an ultrasonic vibration is applied to the capillary 4 by the horn so that the wire 3 is bonded.

Afterward, the capillary 4 is raised to a fixed position; then, the clamper 6 is closed and the capillary 4 and clamper 6 are both raised so that the wire 3 is cut as shown in FIG. 3g.

One wire connecting step is thus completed.

Japanese Patent Application Laid-Open (Kokai) No. 57-87143 and Japanese Patent Application Publication (Kokoku) No. 1-26531 may be cited as examples of this type of prior art wire bonding method.

In the wire bonding method of the prior art as described above, the wire 3 is pushed toward the first bonding point 1a when the application of the ultrasonic vibration in the bonding process of the wire 3 is made to the second bonding point 2a. As a result, bending of the wire occurs, and the "looping linearity", which refers to the shape of the wire extending from a first bonding point to a second bonding point as seen from above, deteriorates. Furthermore, if the width of the second bonding point 2a, which is generally a lead, is narrow or if the surface conditions of the lead are poor, in other words, if the lead is contaminated or oxidized by a paste, etc., then a mere application of an ultrasonic vibration results in poor bonding characteristics (adhesion), and a stable bonding performance is not obtained.

SUMMARY OF THE INVENTION

Accordingly, the object of the present invention is to provide a wire bonding method which provides an improved looping linearity and bonding characteristics.

The object of the present invention is accomplished by a unique method used in a wire bonding method in which a first bonding point and a second bonding point are connected by a wire by means of ultrasonic vibration applied to a capillary that carries the wire, and the unique method of the present invention in such a bonding method is that the capillary is moved in the direction opposite from the first bonding point at the same time that an ultrasonic vibration is being applied to the capillary at the second bonding point.

The capillary is moved in the direction opposite from the first bonding point at the same time that the ultrasonic vibration is applied to the capillary at the second bonding point, the wire is prevented from being pushed back toward the first bonding point, and bonding with a good looping linearity can be obtained. In addition, the capillary is moved at the same time that the wire is pressed by the capillary, the strength of the connection between the wire and the lead, which is the second bonding point, is can be, resulting in that a stable bonding strength is obtained even in cases where the lead is narrow or the surface conditions of the lead are poor.

The movement of the capillary in the opposite direction from the first point can be performed slightly after the application of the ultrasonic vibration. In this case either, the same effect as in the above can be obtained.

DETAILED DESCRIPTION OF THE INVENTION

Figure 1:
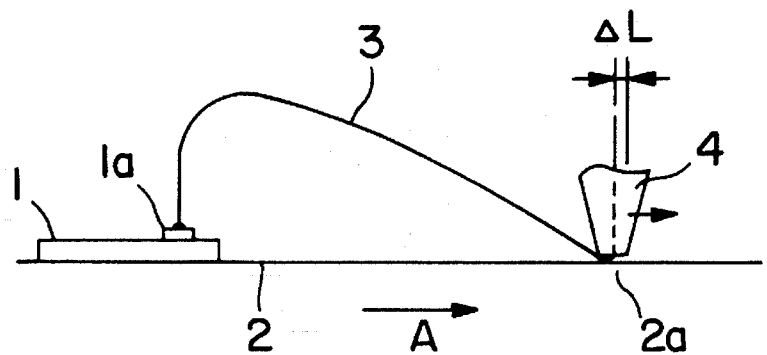
FIG. 1 is a wire connection according to one embodiment of the present invention.
Figure 2:
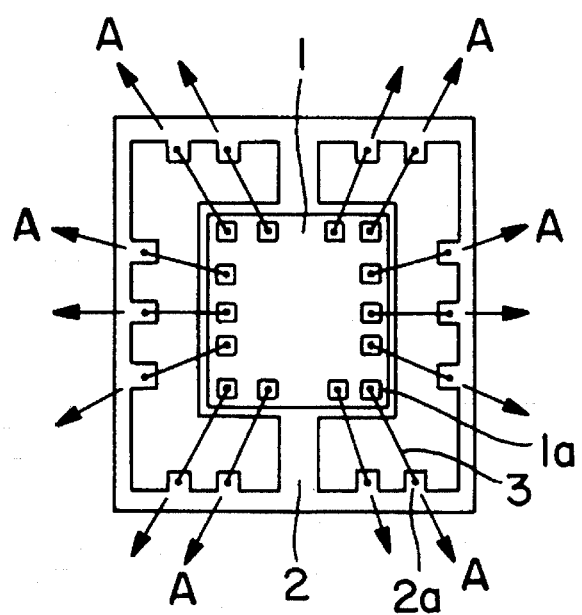
FIG. 2 is plan view of a wire-bonded sample.

One embodiment of the present invention will be described with reference to FIG. 1 along with FIG. 3. The present invention is to solve the problems encountered during the bonding of the wire to the second bonding point 2a. Accordingly, the steps and track along which the capillary 4 is moved from the first bonding point 1a to the second bonding point 2a will not be described in detail. In other words, the capillary 4 is moved from the first bonding point 1a to the second bonding point may be any desired track.

The bonding at the first bonding point and the movement of the capillary to the second bonding point is accomplished in the following manner as in the prior art shown in FIGS. 3a through 3e. Accordingly, the steps of these movements will be described below briefly:

First, the ball 3a is formed on the bonding wire 3 by the spark discharged by the electric torch 5, and the capillary 4 is moved to the first bonding point 1a, so that the ball 3a is pressed against the first bonding point 1a. Thereafter, an ultrasonic vibration is applied to the capillary 4 by the horn that holds the capillary 4, thus bonding the ball 3a. When bonding has thus been done, the capillary 4 is raised and moved to above the second bonding point 2a.

Figure 3A:
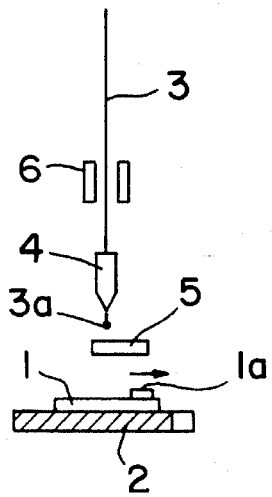
FIGS. 3(a) through 3(g) shows the process of the most commonly used wire bonding method.
Figure 3B:
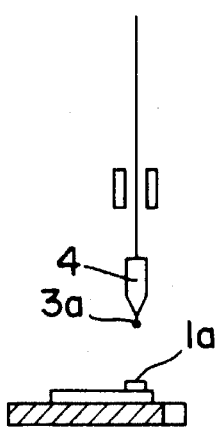
Figure 3C:
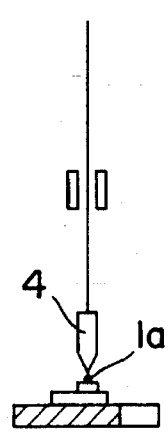
Figure 3D:
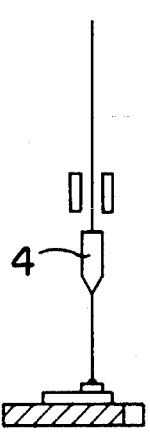
Figure 3E:
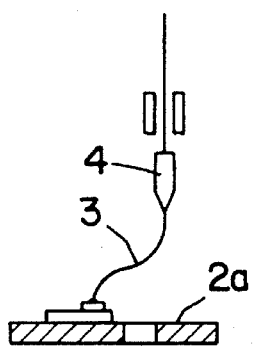
Figure 3F:
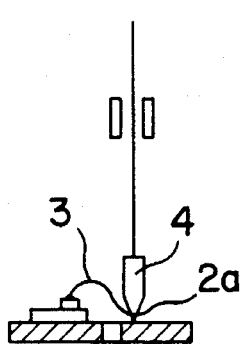
Figure 3G:
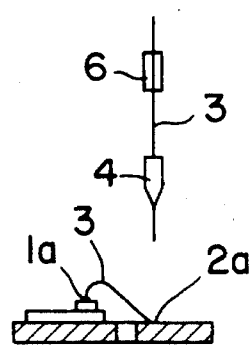

Now back to FIG. 1, the capillary 4 is lowered so that the wire 3 is pressed against the second bonding point 2a by the capillary 4. With the wire 3 in this pressed state, an ultrasonic vibration is applied to the capillary 4, and at the same time, the capillary 4 is moved slightly (or 2.5 to 20 microns) in the opposite direction A from the first bonding point 1a. Bonding at the second bonding point is thus performed. After bonding to the second bonding point 2a has been completed, the capillary 4 is raised to a fixed position, the clamper 6 is closed as seen in FIG. 3(g), and the capillary 4 and clamper 6 are both raised so that the wire 3 is cut as in a conventional method.

In the above, the capillary 4 is moved in the direction A at the same time that the ultrasonic vibration is applied to the capillary 4; however, it is possible to design it so that the capillary 4 is moved in the direction A slightly after the ultrasonic vibration has been applied to the capillary 4. Such a delay can be 10–20 ms after the application of the ultrasonic vibration.

When the capillary 4 is thus moved a certain distance (or a distance delta ($\Delta$) L which is 2.5 to 20 microns) in the direction A which is opposite from the first bonding point $1a$ at the same time that an ultrasonic vibration is applied to the capillary 4 at the second bonding point $2a$ or 10–20 ms after the ultrasonic vibration has been applied to the capillary 4, the wire 3 is prevented from being pushed back toward the first bonding point $1a$. Thus, looping with good linearity is obtained. Furthermore, the capillary 4 is moved with the wire 3 while being pressed. Accordingly, the strength of the connection between the wire and the lead, which is the second bonding point, is increased, and a stable bonding strength is obtained even in cases where the lead is narrow or the surface conditions of the lead are poor.

As seen from the above, according to the present invention, the capillary is moved in the opposite direction from the first bonding point when the ultrasonic vibration is being applied to the capillary during bonding to the second bonding point. Accordingly, the looping linearity and bonding characteristics are both improved remarkably.

We claim:

1. A wire bonding method in which a first bonding point and a second bonding point are connected by a wire, said method being characterized in that a capillary is moved in a direction opposite from said first bonding point at the same time that an ultrasonic vibration is applied during bonding to said second bonding point.

2. A wire bonding method in which a first bonding point and a second bonding point are connected with a wire by applying ultrasonic vibration to a capillary which carries said wire, said method comprising the steps of:

bonding said wire to said first bonding point;

moving said capillary to a second bonding point so as to bond said wire to said second bonding point by applying said ultrasonic vibration to said second bonding point, said capillary being moved to a direction which is opposite from said first bonding point when said bonding to said second bonding point is performed by said ultrasonic vibration.

3. A wire bonding method for connecting a first bonding point and a second bonding point with a wire, said method comprising the steps of:

applying at said first bonding point an ultrasonic vibration to a capillary, which carries said wire, so as to bond said wire to said first bonding point;

moving said capillary to a second bonding point; and applying at said second bonding point an ultrasonic vibration to said capillary so as to bond said wire to said second bonding point and simultaneously moving said capillary in a direction opposite from said first bonding point.

4. A wire bonding method according to claim 1, wherein said capillary is moved 2.5 to 20 microns.

5. A wire bonding method according to claim 2, wherein said capillary is moved 2.5 to 20 microns.

6. A wire bonding method according to claim 3, wherein said capillary is moved 2.5 to 20 microns.

7. A wire bonding method in which a first bonding point and a second bonding point are connected by a wire, said method being characterized in that a capillary is moved in a direction opposite from said first bonding point 10–20 ms after an ultrasonic vibration has been applied during bonding to said second bonding point.

* * * * *